US009093527B2

(12) United States Patent
Knaipp et al.

(10) Patent No.: US 9,093,527 B2
(45) Date of Patent: Jul. 28, 2015

(54) HIGH-VOLTAGE TRANSISTOR AND COMPONENT CONTAINING THE LATTER

(75) Inventors: Martin Knaipp, Unterpremstätten (AT); Georg Röhrer, Graz (AT)

(73) Assignee: AMS AG, Unterpremstaetten (AT)

( * ) Notice: Subject to any disclaimer, the term of this patent is extended or adjusted under 35 U.S.C. 154(b) by 1525 days.

(21) Appl. No.: 12/085,203

(22) PCT Filed: Nov. 13, 2006

(86) PCT No.: PCT/EP2006/010861
§ 371 (c)(1),
(2), (4) Date: Aug. 13, 2009

(87) PCT Pub. No.: WO2007/057137
PCT Pub. Date: May 24, 2007

(65) Prior Publication Data
US 2009/0302383 A1 Dec. 10, 2009

(30) Foreign Application Priority Data
Nov. 16, 2005 (DE) .......................... 10 2005 054 672

(51) Int. Cl.
| H01L 29/78 | (2006.01) |
| H01L 21/336 | (2006.01) |
| H01L 29/06 | (2006.01) |
| H01L 29/10 | (2006.01) |
| H01L 29/423 | (2006.01) |

(52) U.S. Cl.
CPC ........ *H01L 29/7835* (2013.01); *H01L 29/0638* (2013.01); *H01L 29/105* (2013.01); *H01L 29/1041* (2013.01); *H01L 29/7833* (2013.01); *H01L 29/4238* (2013.01); *H01L 29/42368* (2013.01)

(58) Field of Classification Search
CPC ............ H01L 29/0638; H01L 29/1041; H01L 29/105; H01L 29/42368; H01L 29/4238; H01L 29/7833; H01L 29/7835
USPC .................. 257/392, 500, E21.633, E27.061, 257/E27.062, E29.256, 333–349; 438/514, 438/217–229, 517
See application file for complete search history.

(56) References Cited

U.S. PATENT DOCUMENTS 5,545,911 A 8/1996 Otsuki et al.
6,489,657 B1 12/2002 Mori
(Continued)

FOREIGN PATENT DOCUMENTS

DE 10 2004 014928 10/2005
EP 0 677 876 4/1995
(Continued)

*Primary Examiner* — Cuong Q Nguyen
(74) *Attorney, Agent, or Firm* — McDermott Will & Emery LLP

(57) ABSTRACT

A high-voltage NMOS transistor with low threshold voltage. The body doping that defines the channel region is in the form of a deep p-well. An additional shallow p-doping is arranged as a channel stopper on the transistor head. This additional shallow p-doping is produced in the semiconductor substrate at the end of the deep p-well that faces away from the channel region, and extends up to a location underneath a field oxide region that encloses the active window. The leakage current of the parasitic transistor at the transistor head is suppressed with the channel stopper.

9 Claims, 3 Drawing Sheets

(56) References Cited

U.S. PATENT DOCUMENTS

2005/0139869 A1* 6/2005 Akiba et al. .................. 257/224
2005/0194648 A1   9/2005 Kim

FOREIGN PATENT DOCUMENTS

| EP | 1 085 574 | 3/2001 |
| WO | WO 97/19516 | 5/1997 |

* cited by examiner

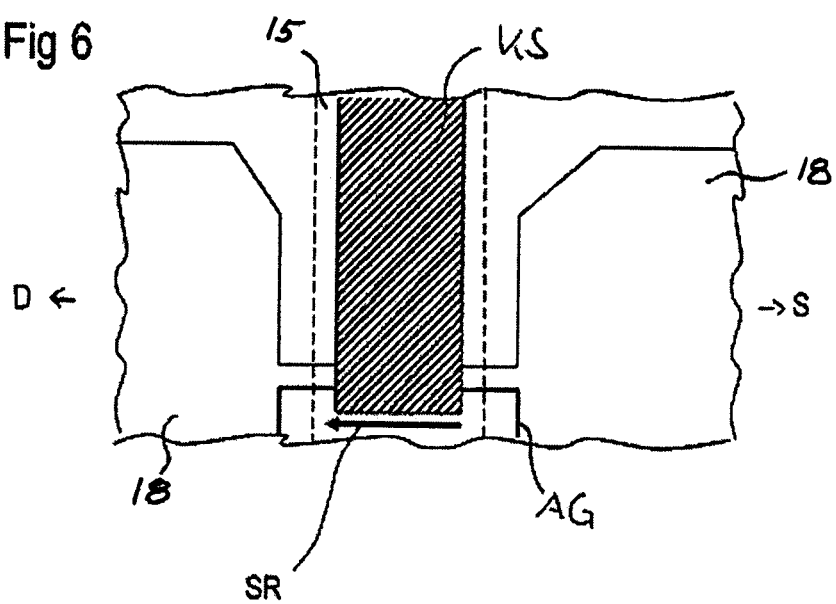

HIGH-VOLTAGE TRANSISTOR AND COMPONENT CONTAINING THE LATTER

RELATED APPLICATIONS

This is a U.S. national stage of application No. PCT/EP2006/010861, filed on 13 Nov. 2006.

This application claims the priority of Germany application no. 10 2005 054 672.2 filed Nov. 16, 2005, the entire content of which is hereby incorporated by reference.

FIELD OF THE INVENTION

The present invention is related to a high-voltage transistor having a low threshold voltage, the manufacture of which can be integrated into a method for manufacturing low-voltage transistors and/or other high-voltage transistors without complicated process steps, particularly without additional process steps.

BACKGROUND OF THE INVENTION

In various electronic devices such as, for example, computers, telecommunication terminals and consumer electronics, different electronic components, and in particular, semiconductor components are required that respectively provide specific functions. Electronic devices also become increasingly multifunctional and the individual functions become increasingly complex. This results in a demand for semiconductor components suitable for use in such devices, that are multifunctional and much more complex than components available today.

The properties of semiconductor components are essentially defined by the processes of manufacturing these components. Because the semiconductor components have become increasingly complex, the processes for manufacturing such semiconductor components have also become more diverse. In order to manufacture different types of electronic components, particularly semiconductor components, using a common manufacturing process, it becomes necessary to increase the number of manufacturing steps. However, this has the disadvantage that manufacturing costs, as well as error rates, increase with the number of manufacturing steps. It is therefore advantageous to develop process steps that can be used in various ways and therefore can also be used in parallel in the manufacture of different components, if so required.

Transistors with different properties, and in particular, with different operating voltages are required in semiconductor components. In this respect, it is preferred to use transistors with a relatively low threshold voltage (VTH) referred to a maximum permissible gate voltage. In applications with signaling lines, it is possible to realize small component dimensions and a transistor driver arrangement with a small overall size.

Optimized transistors with different maximum gate voltages usually require different gate oxide thicknesses. However, the threshold voltage increases with the gate oxide thickness. In order to lower this threshold voltage, it is possible to reduce the net doping in the channel region directly beneath the gate oxide. In conventional manufacturing methods, this is realized by carrying out a so-called threshold-adjust-implant. This makes it possible to adapt the net concentration of the dopants to a desired value, wherein the net concentration can be increased as well as decreased with a threshold-adjust-implant.

However, such an implant requires additional adaptation steps that increase the costs for the manufacture of transistors, and in particular, high-voltage transistors with relatively large gate oxide thicknesses.

US2005/0194648A1 discloses a semiconductor component with different transistors that have different gate oxide thicknesses, with this semiconductor component having a relatively low threshold voltage.

SUMMARY OF THE INVENTION

One object of the present invention is to provide a high-voltage transistor having a low threshold voltage, the manufacture of which can be integrated into a method for manufacturing low-voltage transistors and/or other high-voltage transistors without complicated process steps, particularly without additional process steps.

This and other objects are attained in accordance with one aspect of the invention directed to a high-voltage NMOS transistor, in which source and drain regions are respectively provided in the form of n-doped regions on both sides of a channel region that is arranged underneath a gate electrode. The channel region is defined as a deep p-well in the semiconductor substrate. In addition, a doping region that acts as a channel stopper is provided and makes it possible to prevent leakage currents through the parasitic transistors at the transistor head.

The channel stopper is realized in the form of an additional shallow p-doping that is arranged at the transistor head, i.e., at the end of the channel region pointing away perpendicularly to the transistor current direction and thus at the end of the deep p-well, and extends as far as underneath a field oxide region that defines the active region (active window). This arrangement makes it possible to significantly reduce the threshold voltage in the actual channel region without inducing leakage currents through parasitic transistors at the transistor head. In comparison with known high-voltage NMOS transistors, the proposed transistor is characterized by a low net doping concentration that, however, is achieved, not by means of an additional implantation step for compensating existing charge carriers as in known transistors, but rather by foregoing higher doping in the channel region. This eliminates the need to subsequently reduce the channel net doping by means of an additional dopant implantation. This simplifies the process and makes the manufacture of this transistor compatible with the manufacture of low-voltage transistors in which the deep p-well and the shallow p-doping are also used. In low-voltage NMOS transistors, for example, the deep p-well and a p-doping realized in the form of a flatter well embedded therein form the channel region of the low-voltage transistor. This means that the invention deviates from the conventional concept used so far, in which the body doping and therefore the channel region in particular are realized identically for all transistors, and different gate oxide thicknesses are achieved by means of the aforementioned additional implantation (threshold-adjust-implant) for adapting the charge carrier density to the gate oxide thickness.

The high-voltage transistor can be realized symmetrically, wherein all components of the transistor are realized as mirror-symmetrical relative to a mirror plane that extends perpendicular to the center of the gate electrode. In this case, the deep p-well can be symmetrically arranged between the source and drain regions. The shallow p-doping is realized with a strip-shaped structure and arranged within the deep p-well such that it defines both sides of the channel region at the transistor heads.

In a symmetric high-voltage transistor, the gate electrode may feature a narrowing in the area of the channel region, on both sides of which the gate electrode once again increases in width. The deep p-well may intersect the gate electrode in the region of the narrowing in this case. The shallow p-doping may be partially arranged underneath the narrowed region of the gate electrode on the transistor head.

The surface net dopant concentration underneath the field oxide is chosen in such a way for the shallow p-doping that the (net) dopant concentration on the silicon/field oxide boundary surface is greater than in the region of the deep p-well outside the shallow p-doping embedded therein. This results in a well-functioning channel stopper that suppresses the leakage current at the transistor head from the parasitic element forming at this location. A high implantation energy during production of the shallow p-doping makes it possible to orient the relative adjustment of the implantation masks for the shallow p-doping and the deep p-well such that the shallow p-doping is only partially embedded in the deep p-well, without causing any negative effects on the channel stopper function.

In order to achieve a maximum channel stopper effect with a minimal overall surface used, the relative arrangement is advantageously chosen such that only a partial overlap of the two doped regions occurs.

In the NMOS high-voltage transistor, the drain region may be realized in the form of a shallow n-well that is embedded in a deep n-well. The deep n-well with a greater lateral dimension extends from the drain region to a location underneath a part of the gate electrode of the transistor, and thus forms a drift region that borders the channel region.

In a symmetric high-voltage transistor, the source region is realized analogously to the drain region, such that possibly existing drift zones are also arranged symmetrically.

The doping regions used for the high-voltage NMOS transistor may be realized similarly to doping regions that can be used in the manufacture of high-voltage PMOS transistors and low-voltage transistors. This makes it possible to realize an electronic semiconductor component that features at least one high-voltage PMOS transistor, at least one low-voltage transistor, and at least one high-voltage NMOS transistor, wherein the manufacturing process according to the invention is carried out in such a way that individual process steps can be used in parallel in order to manufacture different elements of different transistors. In particular, implantations for doped regions and wells can preferably be realized simultaneously for different elements of different transistors, such that these steps can be carried out simultaneously and in parallel for different elements.

For example, it is possible to form the drift zone in the high-voltage PMOS transistor from the same deep p-well that forms the channel region in the proposed high-voltage NMOS transistor. It is furthermore possible to produce the channel region in the low-voltage transistor of the NMOS type by means of two interlaced implantations, wherein one of the wells corresponds to the deep p-well for the channel region of the high-voltage NMOS transistor and the second well embedded therein corresponds to the shallow p-doping for the channel stopper in the HV-NMOS transistor. This significantly higher channel doping in the low-voltage transistor is necessary because the gate oxide thickness and thusly the maximum permissible gate voltage is reduced in comparison with the high-voltage transistor.

BRIEF DESCRIPTION OF THE DRAWINGS

Embodiments of the invention are described in greater detail below with reference to the corresponding figures. The figures show purely schematic representations and are not drawn true-to-scale, so that neither absolute nor relative dimensions can be inferred from these figures.

The figures show:

FIG. 6, an inventive symmetric HV-NMOS transistor in the form of a top view.

DETAILED DESCRIPTION OF THE DRAWINGS

Figure 1:
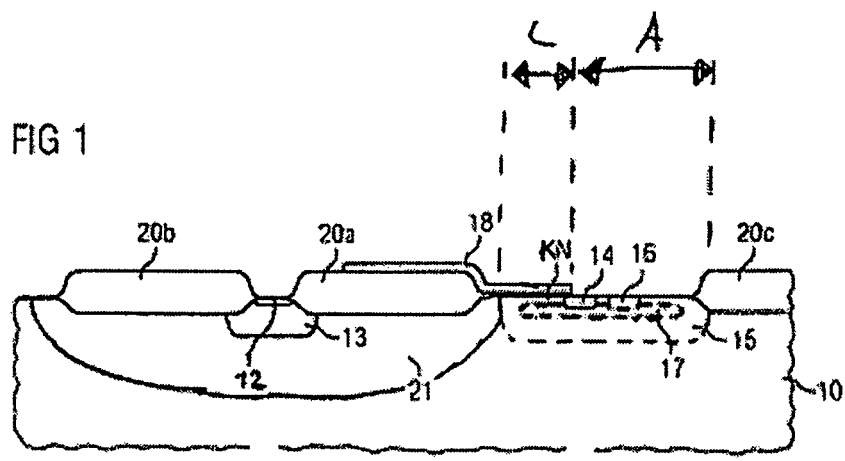
FIG. 1, a HV-NMOS transistor in the form of a schematic cross section.

FIG. 1 shows a schematic cross section through an inventive HV-NMOS transistor and indicates one possible dimension of the doped regions relative to the remaining structures. In this transistor, a channel region KN with a length L is arranged between a drain 12 and a source 14 underneath a gate electrode 18 that consists, for example, of doped polysilicon. A drift zone extends from the drain 12 up to the border of the channel region KN, wherein said drift zone is formed by a shallow n-well 13 that is embedded in a deep n-well 21. The channel region KN that features the body doping is formed by a deep p-well 15. The reference symbol A identifies its dimension beyond the channel region and the gate electrode 18. The reference symbol 16 identifies a $p^+$-doped body terminal that may be selectively arranged above a shallow p-doping 17 embedded in the deep p-well 15. In a not-shown variation, a field oxide region may also be provided between the body terminal and the source 14.

A first active region is formed between field oxide regions 20a and 20c. In this active window, the channel region is defined by the overlap of the gate electrode 18 with the body or the body doping 15.

The drain 12 is arranged in the second active region that is enclosed between field oxide regions 20a and 20b, which are preferably arranged annularly. The substrate 10 may feature a weak p-doping.

Figure 4:
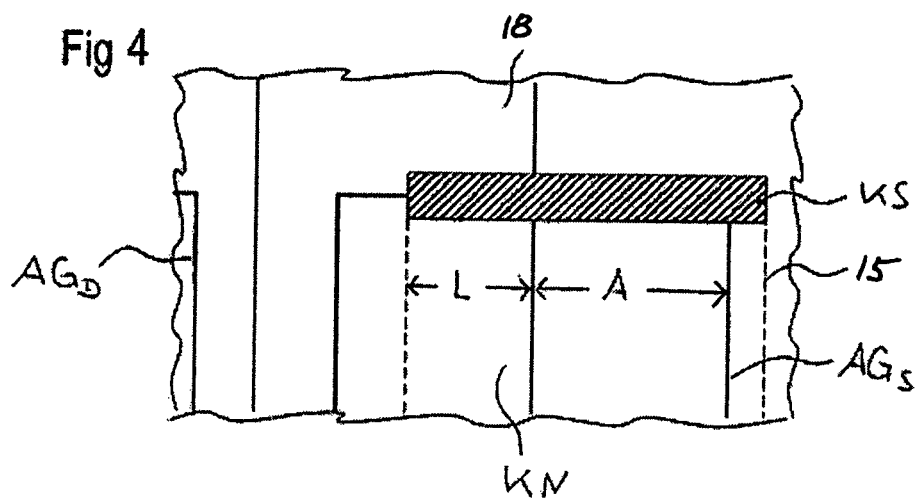
FIG. 4, an inventive HV-NMOS transistor in the form of a top view.

FIG. 4 shows a top view of the HV-NMOS transistor in the area of the first active region $AG_S$, in which the source region is arranged. The channel region is formed by a deep p-well 15 that is arranged in the right half, preferably at the right end, of the first active region $AG_S$. The deep p-well 15 may be wider than the active region $AG_S$ and therefore overlap this active region on the top (see figure) and on the bottom (not illustrated in the figure). On the source side (the right side in the figure), the deep p-well DP may extend beyond the active region $AG_S$, but may also end therewith.

The channel stopper KS is realized in the form of a shallow p-well embedded in the deep p-well 15 and extends over an area of the active region $AG_S$, as well as partially underneath the field oxide regions that enclose the active region. The channel region KN is defined within the active region $AG_s$ by the overlapping with the gate electrode 18 of the deep well 15. The active region $AG_D$ on the drain side that is opened in the field oxide regions is indicated on the left side in the figure.

Figure 5:
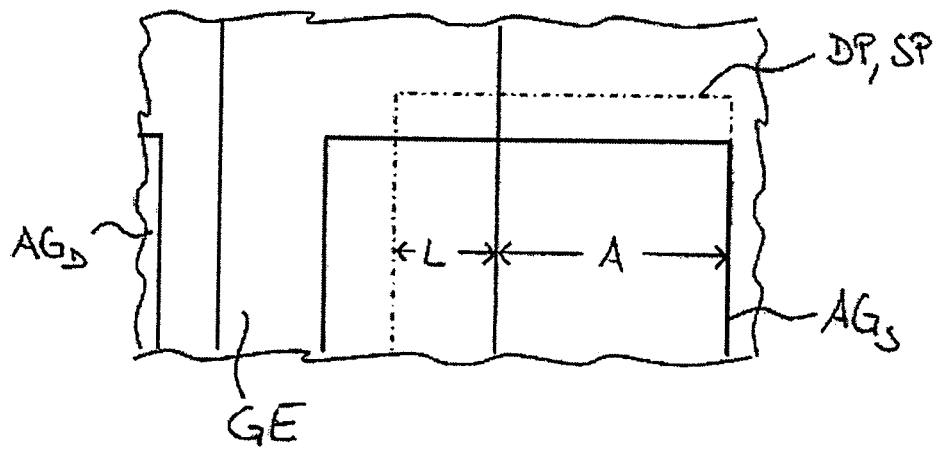
FIG. 5, a known HV-NMOS transistor in the form of a top view.

FIG. 5 shows an arrangement for a HV-NMOS transistor known from the state of the art in the form of a corresponding schematic top view. In contrast to the proposed HV-NMOS transistor, the body doping forming the channel region of the known HV-NMOS transistor consists of two wells that are embedded in one another: a shallow p-well SP that is arranged within a deep p-well DP. Both wells extend over the entire width of the active window up to a location underneath the field oxide, and are approximately congruent.

Such a well arrangement makes it possible to achieve a relatively high dopant net concentration on the surface of the substrate that increases the threshold voltage with a correspondingly thick gate oxide. In the HV-NMOS transistor illustrated in FIG. 5, an additional adaptive implantation was required in order to lower the threshold voltage, in particular a phosphorus implantation for reducing the concentration of the acceptors on the surface of the substrate.

In the invention according to FIG. 4, the doping of the channel region KN is defined by the doping of the deep p-well 15 that leads to a significantly lower acceptor concentration on the substrate surface underneath the gate oxide, and therefore results in a lower threshold voltage.

FIG. 6 shows a horizontal projection of an option for realizing the invention in a symmetric HV-NMOS transistor. Such a transistor is symmetrically constructed and features a symmetry element in the form of a mirror plane that extends perpendicular to the switching path of the transistor between the source and the drain, namely above the center of the gate electrode 18. The gate electrode 18 features a narrowing in its center, and overlaps the active region AG that is opened between the field oxide regions with the narrowing. The gate electrode widens once again in the direction of the source S and the drain D.

The doping of the channel region (arranged underneath the channel stopper KS in the figure) is realized in the form of a deep p-well DP, e.g., of strip-shaped design that centrally intersects the gate electrode 18 and is aligned parallel to the y-axis (vertically) in the figure. A shallow p-doping that forms the channel stopper KS is also arranged along this axis. This shallow p-doping is arranged within the deep p-well 15 and situated in the region of both transistor heads. The term transistor head refers to the region that laterally defines the channel region. The transistor switching region (see the current direction identified by the arrow SR), i.e., the channel flow direction between the source S and the drain D, is aligned parallel to the drawn x-axis while a transistor head is respectively situated above and below the channel region (not illustrated in the figure).

In this symmetric HV-NMOS transistor arrangement, the channel region is also defined by the doping of the deep p-well 15 only. The shallow p-doping in the region of the transistor heads that acts as a channel stopper KS switches off the parasitic transistor by increasing the doping at this location, and thus increases the threshold voltage for the parasitic transistor enough that its threshold voltage lies above the maximum gate voltage.

It is advantageous that the dopings used for the inventive HV-NMOS transistor and the implantations used for its manufacture can also be used for other transistors that can therefore be realized on the same substrate and in the same electronic semiconductor component.

Figure 2:
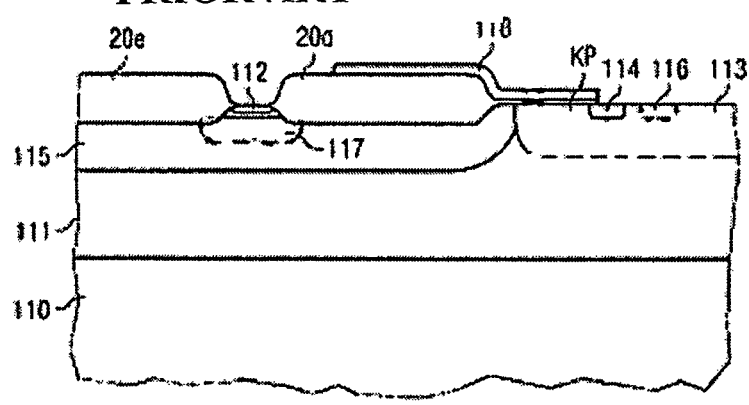
FIG. 2, a known HV-PMOS transistor in the form of a schematic cross section.

FIG. 2 shows a known HV-PMOS transistor (high-voltage MOS transistor with p-type channel) in the form of a schematic cross section. This transistor also features a gate electrode 118 that is arranged between a drain 112 and a source 114 that are illustrated in the form of the corresponding terminal regions. A shallow p-well 117 is arranged underneath the p$^+$-doped drain terminal region 112. This shallow p-well 117, in turn, is embedded in a laterally larger deep p-well 115 that extends deeper into the substrate 111, wherein said deep p-well 115 extends up to the border of the channel region that is formed by a shallow n-well 113. The source terminal 114 is defined on the right edge of the channel region KP by a p$^+$-region. The deep p-well 115 that represents the drift zone of the HV-PMOS transistor can now be easily used for producing the body doping DP for the inventive HV-NMOS transistor. Analogously, the shallow p-well 117 that represents part of the drain doping of the HV-PMOS transistor can be used for producing the channel stopper KS of the HV-NMOS transistor.

Figure 3:
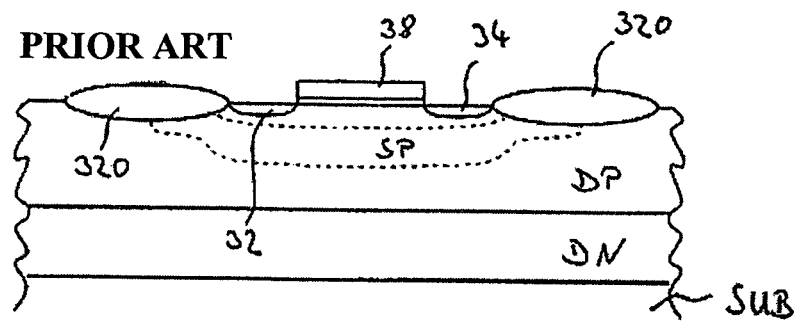
FIG. 3, a known low-voltage NMOS transistor in the form of a schematic cross section.

In another embodiment of the invention, the cited doped wells can also be used for manufacturing low-voltage transistors. FIG. 3 shows a low-voltage NMOS transistor known per se in the form of a schematic cross section. This transistor features a drain 32 and a source 34 between which the gate electrode 38 is arranged, wherein the gate electrode is separated from the substrate by a gate oxide GO or by a comparable electrical insulation of the layer. In accordance with an embodiment of the present invention, the channel zone or body doping is formed by a shallow p-well SP that can be simultaneously used for producing the channel stopper of the HV-NMOS transistor, as described above. In the low-voltage transistor, this shallow p-well SP is embedded in a deep p-well DP, the surface of which extends underneath the entire transistor region. A deep n-well DN that is embedded in the deep p-well DP and serves as insulation between the active transistor region and the substrate may also be provided between the substrate SUB and the deep p-well DP.

Surprisingly, it was determined that the inventive HV-NMOS transistor has a negligible leakage current due to parasitic transistors despite its low body doping, and that the inventive transistor can be realized with a low threshold voltage, for example, of 1.2 V. The body doping of this HV-NMOS transistor forms part of the process flow for the manufacture of the complementary HV-PMOS transistor, and can also be used for the manufacture of the low-voltage NMOS transistor.

Consequently, the inventive HV-NMOS transistor can be manufactured entirely with already implemented procedural and process steps, and requires no additional procedural steps despite its reduced threshold voltage. In addition, the presented concept makes it possible to achieve a sufficiently low threshold voltage if different transistors have different gate oxide thicknesses, without requiring a complicated adaptation of the entire process. A transistor family that features a HV-PMOS transistor and a low-voltage transistor in addition to the inventive HV-NMOS transistor or an electronic component that features different transistors of these types therefore can be manufactured in a particularly cost-efficient fashion.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:
1. A high-voltage NMOS transistor with a low threshold voltage, with a semiconductor substrate in which a source region and a drain region are respectively produced in the form of an n+-doped region on both sides of a channel region that is arranged vertically underneath a gate electrode,
wherein the channel region is defined by a deep p-well in the semiconductor substrate, and wherein an additional shallow p-doping operating as a channel stopper at the transistor head is arranged in the semiconductor substrate at the end of the deep p-well that faces away from the channel region, and the channel stopper extends as far as a location underneath a field oxide region that encloses a first active region, wherein the source region is in the first active region, wherein the drain region is in a second active region, wherein the first active region comprises a first boundary proximal to the second active region, an opposite second boundary distal to the second active region, and lateral boundaries arranged between the first and second boundaries, and wherein the channel stopper is arranged at at least one of the lateral boundaries, and wherein the deep p-well is arranged symmetrically between the source region and the drain region, wherein the shallow p-doping is arranged within the deep p-well and delimits the channel region on the transistor head on both sides, wherein the gate electrode features a lateral narrowing section in the area disposed above of the channel region and increases in width on both sides of the lateral narrowing section, wherein the deep p-well transversely intersects the at least a portion of the channel region proximal to the lateral narrowing section of the gate electrode, and wherein the shallow p-doping on the transistor head is partially arranged underneath the lateral narrowing section of the gate electrode.

2. The transistor according to claim 1, wherein the shallow p-doping is only partially embedded in the deep p-well.

3. The transistor according to claim 1, wherein a shallow n-well is embedded in a deep n-well in the drain region, and wherein the deep n-well extends in the form of a drift region from the drain region to a location underneath the gate electrode of them transistor and borders on the channel region.

4. The transistor according to claim 3, wherein the source region is symmetrical to the drain region.

5. An electronic semiconductor component with a transistor according to claim 1, further comprising at least one high-voltage PMOS transistor, wherein a drift zone in the high-voltage PMOS transistor shares the same deep p-well as the doping of the channel region of the high-voltage NMOS transistor.

6. An electronic semiconductor component with a transistor according to claim 1, further comprising at least one low-voltage transistor of the NMOS type, the channel region of which is comprised of the same shallow p-doping as the channel stopper of the HV-NMOS, wherein the shallow p-doping of the low-voltage transistor is also embedded in a deep p-well.

7. A method for manufacturing a semiconductor component with a high-voltage NMOS transistor and a high-voltage PMOS transistor, comprising:

performing an implantation of dopant in order to produce a deep p-well that forms a drift zone for the high-voltage PMOS transistor and a channel region for the high-voltage NMOS transistor; and performing an implantation of dopant in order to produce an additional shallow p-well that forms part of a drain doping for the high-voltage PMOS transistor and a channel stopper for the high-voltage NMOS transistor in a region that laterally defines the channel region, wherein a channel region for a low-voltage NMOS transistor is produced with the implantation of the shallow p-well, and wherein the shallow p-well is embedded in a deep p-well in the low-voltage NMOS transistor, wherein the shallow p-well extends as far as a location vertically underneath a field oxide region that encloses a first active region, wherein a source region is in the first active region, wherein a drain region is in a second active region, wherein the first active region comprises a first boundary proximal to the second active region, an opposite second boundary distal to the second active region, and lateral boundaries arranged between the first and second boundaries, and wherein the channel stopper is arranged at least one of the lateral boundaries, and wherein the deep p-well is arranged symmetrically between the source region and the drain region, wherein the shallow p-well is arranged within the deep p-well and delimits the channel region on the transistor head on both sides, wherein the gate electrode features a lateral narrowing section in the area disposed above of the channel region and increases in width on both sides of the lateral narrowing section, wherein the deep p-well transversely intersects the at least a portion of the channel region proximal to the lateral narrowing section of the gate electrode, and wherein the shallow p-well on the transistor head is partially arranged underneath the lateral narrowing section of the gate electrode.

8. The method according to claim 7, wherein the channel stopper is arranged within the deep p-well.

9. The method according to claim 7, wherein the channel region in the low-voltage NMOS transistor is produced with two interlaced implantations, and wherein the deep p-well is also provided for the channel region of the high-voltage NMOS transistor and the shallow p-well embedded therein corresponds to the shallow p-doping for the channel stopper of the high-voltage NMOS transistor.

* * * * *